United States Patent
Tanner et al.

(10) Patent No.: US 6,711,187 B2
(45) Date of Patent: Mar. 23, 2004

(54) RAPIDLY OSCILLATING LASER LIGHT SOURCE

(75) Inventors: Allen H. Tanner, Sandy, UT (US); Dennis F. Elkins, Draper, UT (US); Cameron C. Farmer, Sandy, UT (US); Yuri S. Grapov, Sandy, UT (US)

(73) Assignee: Evans & Sutherland Computer Corporation, Salt Lake City, UT (US)

( * ) Notice: Subject to any disclaimer, the term of this patent is extended or adjusted under 35 U.S.C. 154(b) by 54 days.

(21) Appl. No.: 10/127,987

(22) Filed: Apr. 22, 2002

(65) Prior Publication Data

US 2003/0198262 A1 Oct. 23, 2003

(51) Int. Cl.$^7$ ................................................ H01S 3/13
(52) U.S. Cl. .................................... 372/30; 372/25
(58) Field of Search ................. 372/29.02, 6, 30, 372/25

(56) References Cited

U.S. PATENT DOCUMENTS

| | | | |
|---|---|---|---|
| 3,736,526 A | 5/1973 | Simmons | |
| 3,737,573 A | 6/1973 | Kessler | |
| 3,818,129 A | 6/1974 | Yamamoto | |
| 3,831,106 A | 8/1974 | Ward | |
| 4,197,559 A | 4/1980 | Gramling | |
| 4,399,861 A * | 8/1983 | Carlson | 164/453 |
| 4,582,396 A | 4/1986 | Bos et al. | |
| 4,720,747 A | 1/1988 | Crowley | |
| 4,893,353 A | 1/1990 | Iwaoka et al. | |
| 4,912,526 A | 3/1990 | Iwaoka et al. | |
| 5,088,095 A | 2/1992 | Zirngibl | |
| 5,255,274 A | 10/1993 | Wysocki et al. | |
| 5,633,750 A | 5/1997 | Nogiwa et al. | |
| 5,658,060 A | 8/1997 | Dove | |
| 5,740,190 A | 4/1998 | Moulton | |
| 5,920,361 A | 7/1999 | Gibeau et al. | |
| 6,094,298 A | 7/2000 | Luo et al. | |
| 6,137,932 A | 10/2000 | Kim et al. | |
| 6,195,484 B1 | 2/2001 | Brennan, III et al. | 385/37 |
| 6,233,025 B1 | 5/2001 | Wallenstein | |
| 6,335,941 B1 | 1/2002 | Grubb et al. | 372/96 |
| 6,340,806 B1 | 1/2002 | Smart et al. | 219/121.62 |
| 6,393,036 B1 * | 5/2002 | Kato | 372/18 |
| RE37,993 E * | 2/2003 | Zhang | 372/25 |
| 6,529,531 B1 * | 3/2003 | Everage et al. | 372/20 |
| 2002/0021462 A1 * | 2/2002 | Delfyett et al. | 359/123 |
| 2002/0136121 A1 * | 9/2002 | Salmonsen et al. | 369/47.53 |

* cited by examiner

Primary Examiner—Leon Scott, Jr.
(74) Attorney, Agent, or Firm—Thorpe North & Western, LLP

(57) ABSTRACT

A rapidly oscillating laser light source is produced that exhibits extended pulse duration having a substantially uniform amplified output. A pulsed beam of laser light having a given wavelength, frequency, duration and intensity is produced such that the pulse shape is controlled. The pulsed beam is amplified using a fiber amplifier which exhibits inherent changes in amplifier gain at the frequencies of interest. The fiber amplifier is continuously pumped. A feedback signal is provided with the amplified pulse characteristics and is used to adjust the pulse shape of the pulsed beam of laser light before amplifying, such that the intensity is changed over the pulse duration to generate a substantially uniform amplified output during each pulse.

16 Claims, 3 Drawing Sheets

RAPIDLY OSCILLATING LASER LIGHT SOURCE

BACKGROUND OF THE INVENTION

1. Field of the Invention

The present invention relates generally to oscillating laser light sources. More particularly, the present invention relates to an apparatus and method for producing an amplified rapidly oscillating laser light source which exhibits substantially uniform gain during each pulse with improved efficiency and extended pulse duration. Further, the present invention relates to a method of using the unique rapidly oscillating light source in producing an image or other applications.

2. Related Art

Producing a rapidly oscillating laser light has many potential uses, particularly in producing visual displays, medicine, dentistry, pulse formation, and in communications. One method of producing an oscillating light source is field or color sequential methods. These devices can use a rotating filter of red, blue, and green in front of a projection tube and detecting the color of the projected light to electronically switch the appropriate color input to the projection tube. U.S. Pat. Nos. 4,197,559 and 4,582,396 describe such a system.

Early lasers operated only by pulsing, however such systems require pumping using a flash lamp or similar device which takes time to recharge between pulses. Other methods have used an array of laser diodes which are directly pulsed. Another method is to intermittently disrupt the ability of a laser cavity to resonate. When resonance is restored to the cavity, the energy previously pumped into the cavity is released producing a high power oscillating laser light, often referred to as Q-switching. The resulting pulsed light is often limited to about 50 kHz and has a peaked output signal of short duration with essentially uncontrollable pulse duration. U.S. Pat. No. 3,818,129 describes using rotating mirrors in a Q-switch to produce a color image from three laser light sources.

One of the more recent methods for producing oscillating light includes mode locking. Mode-locked lasers have an absorber placed in the laser cavity which interacts to select preferred modes of oscillation. Upon removal of the absorber the signal and its harmonics are summed. The absorbers are chosen for very specific conditions and make control over a wide range of conditions difficult. Such lasers produce short duration pulses of essentially uncontrollable pulse width at pulse repetition frequencies near 100 MHz. Further, to obtain wavelengths useful in optical display systems would require extraordinarily long cavities of hundreds of meters.

Laser amplifiers are important in producing a laser output at power levels desirable for many applications. One difficulty with many laser fiber amplifiers is that the amplifier gain depends on the power and duration of the incoming light. Particularly, with fiber amplifiers the gain decreases as the input power increases. Further, due to population inversion effects in the amplifier the gain is higher at the beginning of a constant pulse and decreases during the pulse. Several methods have attempted to overcome these problems with varying degrees of success.

In one method of controlling amplifier output, the input and output signals are compared. Based on this comparison the amplifier pump source is adjusted to hold the gain constant. At high pulse speeds, the response of the amplifier may be slower than the pulses. U.S. Pat. 5,633,750 describes a method of rapidly controlling amplifier gain without an input signal which avoids this problem.

Some attention has been spent on pulse shaping and various methods for controlling signal characteristics for ultra-fast laser pulsing systems. Particularly, research on Q-switch laser systems has attempted to improve pulse shape control by various methods including pulse slicing which involves substituting select time intervals of the laser light to produce the desired output. Another variation is to truncate the "tails" of a Gaussian beam to achieve sharp rise times and a narrow pulse, which results in dramatic energy losses and decreased efficiency. Q-switch methods currently do not provide an efficient pulsed laser light source having desirable pulse shape characteristics for use in technologies such as is required in color display systems.

Further, a desirable improvement in the art would be to provide a method of achieving a rapidly oscillating light source having an amplified pulse shape which is substantially rectangular.

SUMMARY OF THE INVENTION

It has been recognized that it would be advantageous to develop a rapidly oscillating light source for use in producing visible light which has a controlled pulse intensity, duration and sharp rise and fall times to produce a substantially rectangular pulse.

The present invention provides a rapidly oscillating laser light source for use in image display systems which includes at least; a pulsed laser light source configured to generate a pulsed beam of light having a predetermined wavelength, frequency, and controlled pulse shape; a fiber amplifier connected to the pulsed laser light source for amplifying the intensity of the pulsed beam of light; and a control system operatively coupled to both the pulsed laser light source and the amplified output. The control system is configured to measure the amplified output and adjust the pulse shape produced by the pulsed laser light source in order to compensate for changes in amplifier gain during each pulse, to produce substantially uniform amplified output.

In accordance with a more detailed aspect of the present invention, the system may include a nonlinear resonator for frequency conversion or mixing to produce laser light in the visible range.

In accordance with another more detailed aspect of the present invention, the system may use a rapid feedback system to adjust the light source and maintain resonant conditions in the laser cavity.

In accordance with yet another more detailed aspect of the present invention, the system may comprise using multiple oscillating laser light sources produced using the method of the present invention to produce an image for use in display systems.

Additional features and advantages of the invention will be apparent from the detailed description which follows, taken in conjunction with the accompanying drawings, which together illustrate, by way of example, features of the invention.

DETAILED DESCRIPTION

Figure 1:
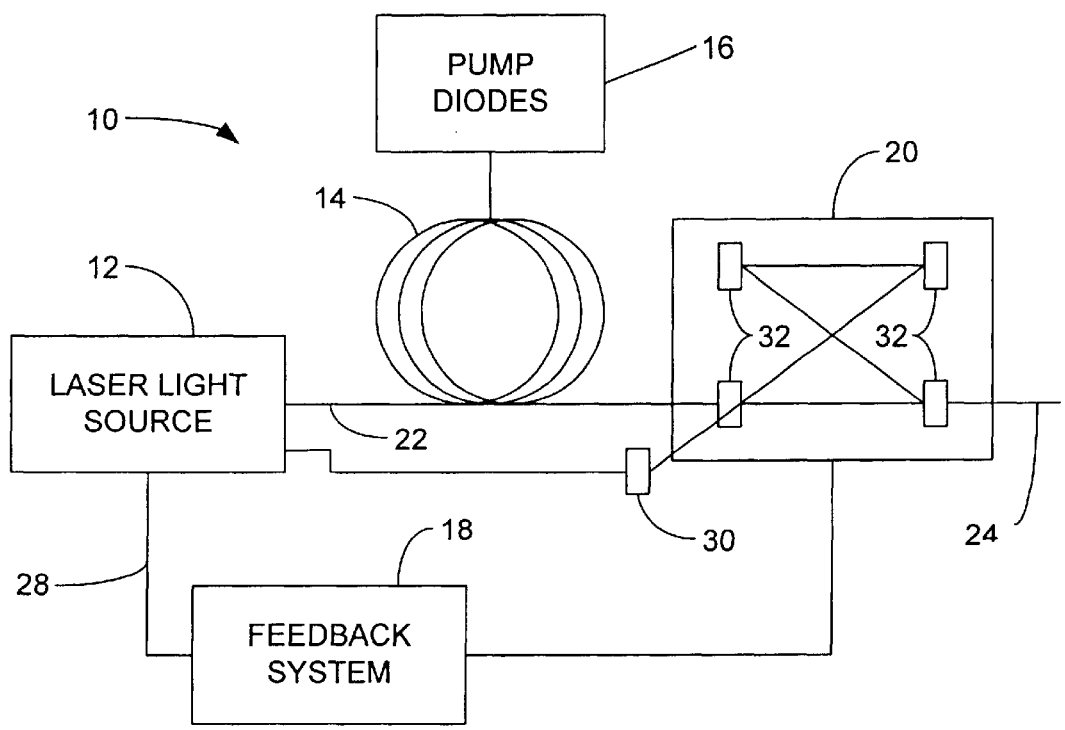
FIG. 1 is a schematic illustration of an embodiment of a rapidly oscillating laser light source in accordance with the present invention.

For the purposes of promoting an understanding of the principles of the invention, reference will now be made to the exemplary embodiments illustrated in the drawings, and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

In describing and claiming the present invention, the following terminology will be used. As used herein, "pulse shape" refers to the intensity of the signal as a function of time during each pulse. Also, "pulse duration," as used herein, refers to the entire width of the pulse measured at half of maximum.

As illustrated in FIG. 1, a system 10, in accordance with the present invention, is shown that operates to produce a rapidly oscillating light source with a controlled pulse shape having a substantially rectangular shape. Color projection systems and industrial applications are examples of fields which may benefit from use of such a system. For example, column sequential color display techniques illuminate 2048 columns about every 8 μsec. The rapidly oscillating light source of the present invention provides for oscillations in this range. The invention provides a laser light source, which is pulsed such that the amplitude of the light source changes during the pulse to compensate for the change in amplifier gain during each pulse to create a substantially uniform output pulse amplitude with sharp rise and fall times. The steps utilized in producing the desired, improved light output is described below and illustrated in FIG. 3, which is discussed in conjunction with FIGS. 1–2.

With reference to FIG. 1, the system 10 includes a laser light source 12, a fiber amplifier 14, coupled to laser light source 12, a plurality of pump diodes 16, coupled to amplifier 14, and a feedback system 18, coupled to the light source 12 and amplifier 14. In one embodiment, laser light source 12 is a fiber laser light source, which is doped with an optically active rare-earth element, usually a lanthanide. The dopant selected depends on the desired wavelength and may include $Yb^{3+}$, $Er^{3+}$, $Nd^{3+}$, $Ho^{3+}$, $Tm^{3+}$, mixtures thereof, and other optically active elements or compounds. Other types of laser light sources are contemplated in the present invention. One such laser light source is a distributed feedback (DFB) laser, which has several advantages over other laser light sources such as diode and other Fabry-Perot type lasers. DFB lasers provide narrower linewidth and a pure Gaussian beam, unlike typical Fabry-Perot lasers. Fiber lasers also provide a substantially uniform frequency, ease of frequency tuning, and high spatial beam quality.

Distributed feedback lasers and distributed Bragg lasers both have integrated gratings and waveguide properties that allow for significant control of the gain, phase, and grating filter. Through adjusting the components of these laser light sources a considerable range of frequencies and gains can be achieved. Additionally, master oscillator power amplifier (MOPA) laser systems can also be utilized as they provide the control necessary in the present invention.

Figure 2A:
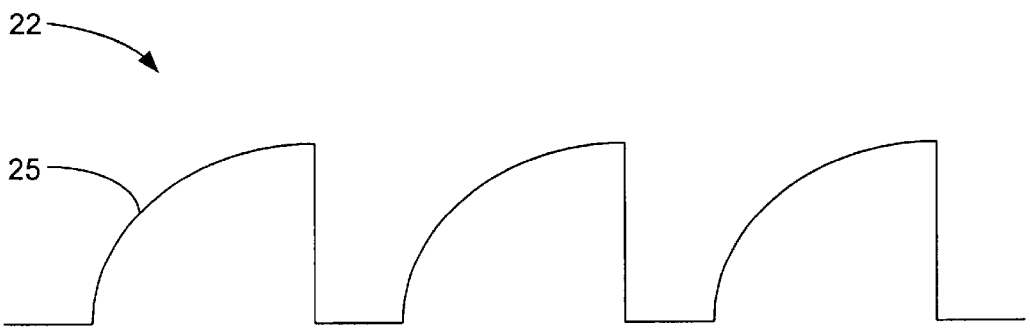
FIG. 2a is a schematic illustration of a series of modulated light source pulses as a function of time.
Figure 3:
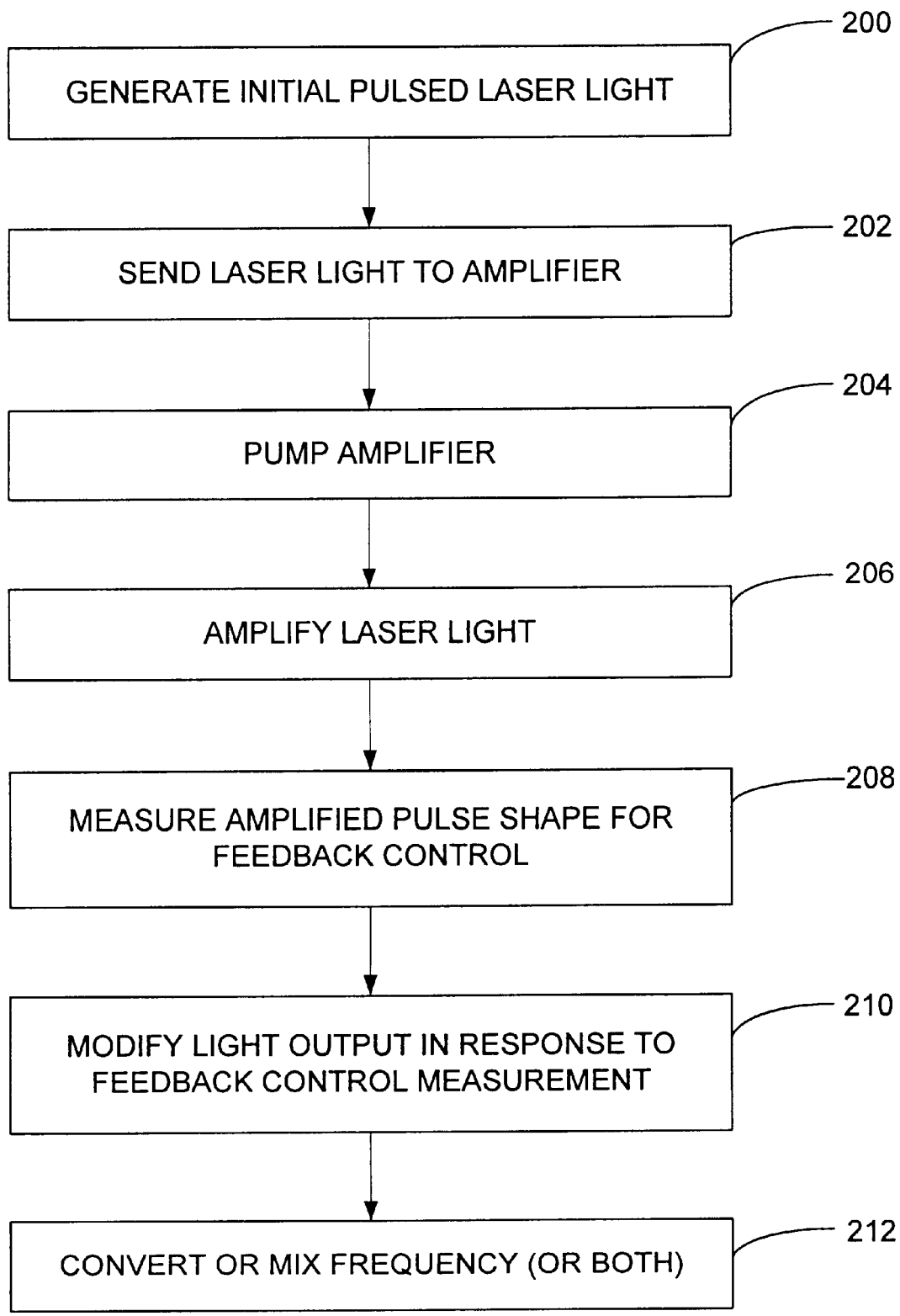
FIG. 3 depicts a flow diagram of the steps performed in generating the amplified pulsed light source as embodied in the present invention.

The pulsed laser light source 12 of the present invention allows for adjustment of the frequency, wavelength, intensity, and the actual pulse shape of the source signal. This control may be accomplished using methods such as turning seed laser diodes 16 on and off, controlling the drive current of a doped fiber laser, using mechanical actuators or thermal condition, or both, to adjust the fiber resonant conditions and thus the frequency and wavelength, and combinations of these methods. The pulse shape is defined by a feedback signal provided by feedback system 18. Essentially, the desired system is selected to be able to generate a controlled pulse having a ramped gain and sharp fall time as shown in FIG. 2*a*, as disclosed below.

Laser light source 12 generates an initial pulsed laser light 22, as shown in block 200. Pulsed laser light 22, shown in block 202, is directed to fiber laser power amplifier 14, which may be continuously pumped with single or multiple pump diodes 16. Although various power amplifiers can be used in the present invention, a selected amplifier is a double-clad fiber amplifier having multiple pump sources, which is coupled to laser light source 12 via a pulsed laser light fiber one coupling embodiment as described in U.S. application Ser. No. 09/872,200, entitled "Multimode Coupler System," herein incorporated by reference. This type of amplifier may be continuously pumped to increase its efficiency. If no "seed" signal is injected this pumped energy will be spontaneously emitted in a broad, and useless, spectrum. The periodic pulses convert the energy stored in the amplifier into useful, narrow line, coherent output.

The spontaneous emission establishes a lower band on the frequency of the pulses. For the dopants in current use, the limiting frequency is approximately 1 kHz. This storage energy provides an important aspect of the invention. For instance, if 3 watt pulses of ⅓ duty cycle are desired, the amplifier need only have 1 watt continuous capacity. When pulsed, it will produce 3 watts ⅓ the time and zero watts the remaining ⅔ the time.

Other embodiments to couple source laser light 22 with amplifier 14 may also be accomplished using coupling techniques known to those skilled in the art of fiber laser system design such as wavelength division multiplexer (WDM) coupling, direct splicing and free beam optical element coupling. More than one amplifier may be utilized together in a cascade arrangement to achieve the desired output levels.

Amplifier 14 is designated to provide at least a 10-fold increase in intensity of the input light signal 22. Amplifier pump diodes 16 most often have a frequency different from that of the source laser 12 to be amplified. This is because the frequencies are naturally occurring and need to be converted to a more useful frequency. For example, typical pump diodes produce 975 nm light and $Yb^{3+}$ ions in the fiber convert 975 nm light to 1064 nm light. Other combinations of diode frequencies and ion frequencies are available. It is left to the skilled artisan to select the proper diodes and ion combinations. In one embodiment of the present invention a light source at a peak of 10 mW is amplified to produce an output of 10 W.

Conventional erbium-doped fiber (EDF) amplifiers have an undesirable property in that the gain varies with the power and duration of the input signal. Particularly, the gain of EDF amplifiers increases as the power of the input signal decreases. The present invention addresses this problem by configuring the laser light source 22 to pulse based on information about the amplified laser output 24 also shown in FIG. 2c. FIG. 2a is an illustration of an exemplary series of pulses 25 as a function of time. Notice that the pulse intensity of the laser light source is non-uniform during the pulse. The laser light source pulse 25 begins at a baseline, increases up to a specified value, and then sharply falls back to the baseline. The rate of increase during each pulse is typically a non-linear characteristic of the dopant ion. The technique is designed for square pulses, but it equally applicable to pulses of other shapes such as triangle, Gaussian, sinusoidal, et cetera.

Figure 2B:
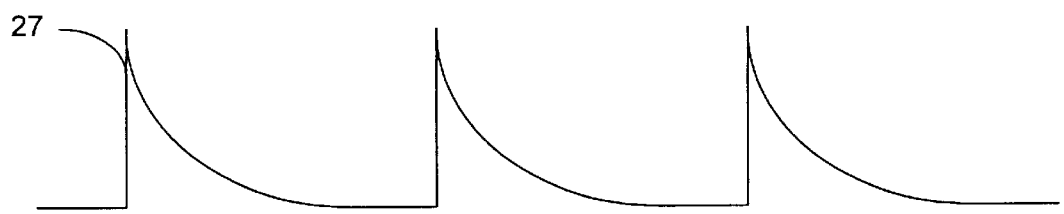
FIG. 2*b* is a schematic illustration of a series of amplifier gain responses to the pulses of FIG. 2*a* as a function of time.
Figure 2C:
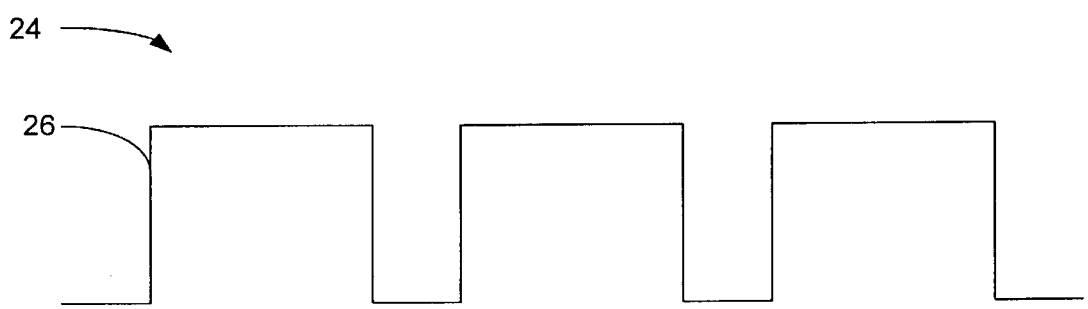
FIG. 2*c* is a schematic illustration of the amplified pulsed output signal resulting from the amplification of the pulses of FIG. 2*a* as a function of time.

Feedback system 18 measures, as shown in block 208, the amplified pulse shape and provides information to the laser light source 12 to adjust the pulse shape, shown in block 210, to compensate for the change in amplifier gain to produce a substantially constant intensity throughout each amplified pulse 26, as shown in FIG. 2c. The resulting amplified pulse 26 has a sharp rise time, substantially uniform intensity over the pulse duration, and a sharp fall time to create a substantially rectangular pulse. This controlled amplified pulse shape provides for longer pulse duration, avoids spikes in intensity, and prevents accompanying damage to equipment.

Amplifier 14, as shown in block 204, is pumped continuously using a single or multiple diodes 16. FIG. 2b illustrates the corresponding amplifier gain for the series of pulses 25 of FIG. 2a. As shown in FIG. 2b, the amplifier gain, per block 206, is substantial at the beginning of each pulse 27 and then drops off as the power of the input signal increases. This is reasonably accurate for frequencies in the 1 kHz–5 kHz range. At higher frequencies, the effect of decreasing amplifier gain is reduced. The resulting amplified output pulse shape 26 has a substantially uniform intensity throughout the pulse duration and is shown in FIG. 2c. Further, each amplified output pulse 26 has a sharp rise and sharp fall time. Both the rise and fall times are typically each less than 200 nanoseconds of the pulse duration.

The resulting pulsed amplified light 24 has a frequency of between about 1 kHz and 500 kHz, a pulse duration of about 8 microseconds to 1 millisecond and an amplitude of between 10 mW to 10W. Preferably, the amplitude is substantially uniform throughout the pulse duration. An intensity distribution during the pulse duration of about less than 10% is appropriate for most display applications. The rise and fall times are approximately 1 microsecond. For commercial applications such as color display systems, high definition television systems (HDTV), pulse widths of 2 microseconds with rise and fall times of 500 nanoseconds and power levels between 1W, such as for home use, and 10Ws, such as for commercial or video cinema use, are particularly useful.

Frequently, the available laser source frequencies must be converted to a more useful frequency depending on the intended application. Thus, also in accordance with the present invention, the output pulse 24 may be optically coupled to a resonator 20 for frequency conversion or mixing or both, shown in block 212. A number of methods may be utilized for frequency conversion or mixing, or both, and such methods are known to those skilled in the art. One method is described in commonly assigned U.S. Patent application Ser. No. 10/017,162, entitled "Apparatus and Method for Frequency Conversion and Mixing of Laser Light," hereby incorporated by reference in its entirety.

Feedback system 18 utilizes a Pound-Drever algorithm to generate a uniform resonator output. A sensor 30 is placed proximate input mirror 32 of the resonator cavity 20 to measure the resonant frequency of the external cavity for providing cavity lock. This same information is typically used as part of the feedback control to the pulsed laser light source 12 to adjust the pulse shape via feedback signal 28.

The present invention utilizes pulsed light and not a continuous signal as described in the above method. As a result, information about the resonant cavity conditions are only available during each pulse. Therefore, control sensor 30 includes a sampling circuit to capture the information for the feedback signal and hold the information during the inactive time between pulses. When the present invention is used in conjunction with a resonator 20 the pulsed laser light source 12 must not only control the pulse shape and frequency but provide for cavity lock conditions as well.

In a continuous output system, the pulsed laser light source 12 operates to provide cavity lock. In a rapidly oscillating system, the pulse laser light source 12 performs not only cavity lock, but also controls pulsed output, amplifier power level control, and sampling of feedback control signals. This is important since the fiber amplifier 14 is pumped continuously to store energy within the amplifier in order to boost the pulse from the light source 12. Amplifier 14 has a varying amount of gain, which starts out large when the pulse first arrives and then attenuates to a smaller gain level during subsequent transmission. Light source 12 modulates its pulse height to compensate for the change that occurs in the gain provided by amplifier 14. Thus, light source 12 is able to adjust its pulse height to control the power output of amplifier 14.

Information about the state of visible light resonator 20 is utilized to control the frequency of the output source from light source 12. Resonator 20 includes a plurality of mirrors 32 placed within a cavity of resonator 20 that are aligned in such a way to receive the amplified light pulses 24 from amplifier 14. Information in the form of a light beam is then received by a sense controller 30, located proximate resonator 20. Sense controller 30 is capable of sampling the information received from resonator 20 during the active time and holding the information during the inactive time in between pulses.

Figure 4:
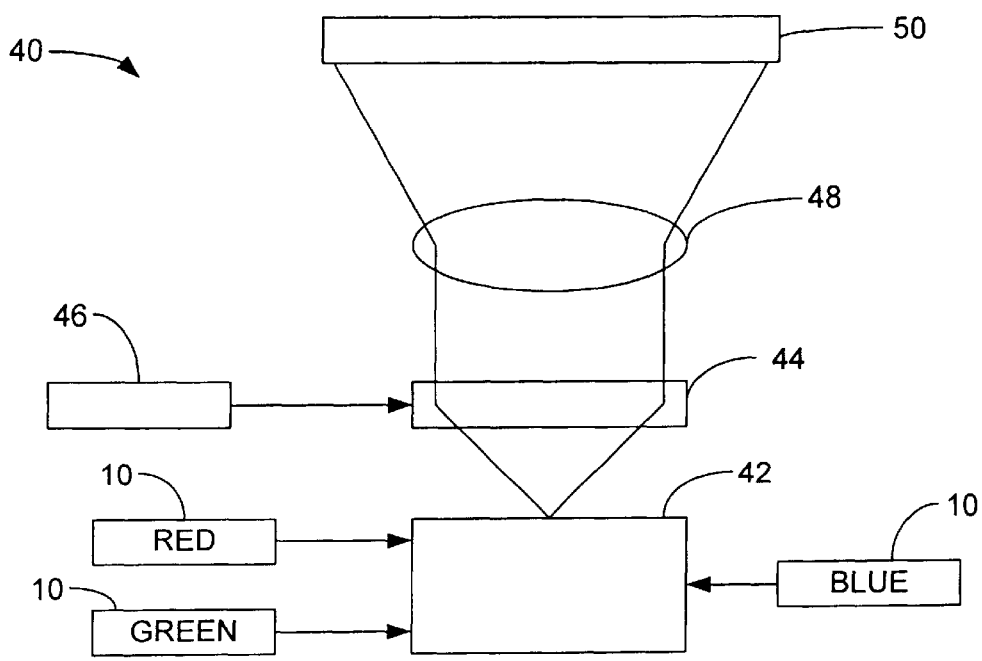
FIG. 4 illustrates an embodiment of a projection system utilizing the rapidly oscillating laser light source of FIG. 1.

In keeping with the present invention the rapidly oscillating light output 24 may be utilized in a projection display system 40, which is illustrated in FIG. 4. Projection display system 40 includes a color combiner 42, which receives the pulse lights from pulse light system 10. Projection display system 40 further includes a modulator 44, synchronization logic 46, and projection optics 48.

Three separate oscillating light sources 10, typically in the red, green, and blue frequency ranges, are assembled within color combiner 42. Once the light is assembled into a single bundle, it is utilized to illuminate modulator 44. Modulator 44 interacts with the pulses of visible or even infrared light to generate an image for display on projection screen 50. Modulator 44 is further controlled by synchronization logic 46, which ensures that the light pulses are delivered to modulator 44 at the correct time. Once modulator 44 operates on the light source, projection optics 48 are utilized to transmit the image from modulator 44 to projection screen 50.

Two laser sources can be utilized in frequency conversion and/or mixing to produce red, blue, and green visible laser light 24. For example, resonantly mixing 1550 nm (from a $Yb^{3+}/Er^{3+}$ doped fiber) and 1064 nm light (from a $Yb^{3+}$ doped fiber), results in a light source having a wavelength of 630.9 nm (red light). Doubling a light source having a wavelength of 1550 nm results in a light having a wavelength of 775 nm and then resonantly mixing with 1064 nm light results in light having a wavelength of 448.4 nm (blue). Doubling a light source having a wavelength of 1064 nm results in light source having a wavelength of 532 nm (green).

Other useful laser light sources include doubling of a light source having a wavelength of 1310 nm (from a $Nd^{3+}/Pr^{3+}$or $Yb^{3+}/Er^{3+}$doped fiber) or 980 nm (from an $Er^{3+}$doped chalcogenide glass fiber) to produce a light source having a wavelength of 655 nm or 490 nm, respectively. The recited wavelengths represent commonly used and readily available laser light sources although other wavelengths may be utilized in the present invention. Further, the substantially uniform pulses illuminate the display for nearly the entire duration of the pulse, unlike the more common peaked pulses. This substantially uniform pulse has the added advantage of reducing the amplitude of the pulse and decreases the potential for damage to equipment along the signal path.

The uniquely oscillating light sources provide a high quality, controlled pulse of laser light. Thus, in review, the red, green, and blue light sources may then be combined using any number of color combining technologies. Color combiner 42 directs the combined light to illuminate modulator 44. Synchronization electronics 46 are used to control the timing of delivery to modulator 44 and are well known in the art. Light from the modulator is transmitted using projection optics 48 to produce an image on a display screen 50.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been shown in the drawings and fully described above with particularity and detail in connection with what is presently deemed to be the most practical and preferred embodiment of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims.

What is claimed is:

1. A rapidly oscillating laser light source for use in image display systems, comprising:
    a) a pulsed laser light source configured to generate a pulsed beam of light having a predetermined wavelength, frequency, and controlled pulse shape;
    b) a fiber amplifier that can change amplifier gain during each pulse and is operatively coupled to the pulsed laser light source to amplify the intensity of the pulsed beam of light to produce an amplified light output; and
    c) a control system, operatively coupled to the pulsed laser light source and the amplified output, to measure the amplified light output and adjust the pulse shape produced by the pulsed laser light source to compensate for changes in amplifier gain during each pulse so as to produce a substantially uniform amplified light output.

2. The device of claim 1, wherein the pulsed laser light source is a distributed feedback laser.

3. The device of claim 1, wherein the pulsed beam of light has a wavelength of 1064 nm.

4. The device of claim 1, wherein the pulsed beam of light has a wavelength of 1550 nm.

5. The device of claim 1, wherein the control system utilizes feedback information to control the pulse shape produced by the pulsed laser light source.

6. The device of claim 5, wherein the pulse shape is rectangular.

7. The device of claim 1, further comprising a non-linear resonator optically coupled to the amplified output for converting the frequency of the amplified output.

8. The device of claim 7, further comprising a feedback mechanism for providing cavity lock within the non-linear resonator.

9. The device of claim 1, wherein the fiber amplifier is optically coupled to the laser light source using an optical fiber coupler.

10. A method of producing a rapidly oscillating visible light laser comprising the steps of:
    a) providing a pulsed beam of laser light at a given wavelength, frequency, duration and intensity wherein the pulse shape is controlled;
    b) amplifying the pulsed beam of laser light; and
    c) modulating the amplified pulsed beam of laser light to adjust the pulse shape of the pulsed beam of laser light before amplifying, such that the intensity is changed over the pulse duration to generate a substantially uniform amplified output during each pulse.

11. The method of claim 10 further comprising the step of d) converting the frequency of the beam of laser light to a desired frequency using a non-linear resonator.

12. The method of claim 10 further comprising the step of e) converting the modulated amplified pulsed beam of laser light from a first frequency to a second frequency.

13. The method of claim 10, wherein the pulsed beam of laser light is 1550 nm.

14. The method of claim 10, wherein the pulsed beam of laser light is 1064 nm.

15. The method of claim 10, comprising the step of f) projecting the amplified output for visual display.

16. The method of claim 10, wherein step c) comprises utilizing feedback information of the amplified pulsed beam of laser light to modulate the amplified pulsed beam of laser light.

* * * * *